United States Patent [19]

Shigemori

[11] Patent Number: 4,816,722
[45] Date of Patent: Mar. 28, 1989

[54] DIGITAL PHASE-LOCKED LOOP FILTER
[75] Inventor: Toshihiro Shigemori, Yokohama, Japan
[73] Assignee: Ricoh Company, Ltd., Tokyo, Japan
[21] Appl. No.: 133,640
[22] Filed: Dec. 16, 1987
[30] Foreign Application Priority Data Dec. 19, 1986 [JP] Japan .................. 61-301590

[51] Int. Cl.⁴ .............................................. H02P 5/00
[52] U.S. Cl. .................................. 318/314; 318/318; 318/327; 331/1 A
[58] Field of Search .................. 328/155; 331/1 A; 318/314, 318, 608, 341, 603, 327, 329, 313

[56] References Cited

U.S. PATENT DOCUMENTS

| | | | |
|---|---|---|---|
| 3,843,914 | 10/1974 | Carlson et al. | 318/327 |
| 4,019,153 | 4/1977 | Cox et al. | 331/1 A |
| 4,242,619 | 12/1980 | Nakamura et al. | 318/341 |
| 4,271,382 | 6/1981 | Maeda et al. | 318/314 X |
| 4,272,712 | 6/1981 | Beling et al. | 318/314 X |
| 4,283,671 | 8/1981 | Nakano et al. | 318/608 |
| 4,355,266 | 10/1982 | Pearson | 318/314 X |

Primary Examiner—Benjamin Dobeck
Attorney, Agent, or Firm—Oblon, Fisher, Spivak, McClelland & Maier

[57] ABSTRACT

A phase-locked loop filter applicable to a motor speed control of an optical disk apparatus and others counts a difference in phase between an input signal to a phase-locked loop and an output signal of the loop, integrates the resulting counts modulo a predetermined value which is dependent upon the period of a clock, produces an overflow signal every time an overflow occurs, and generates the output signal by dividing the frequency of the overflow signal.

8 Claims, 11 Drawing Sheets

Fig. 4A  EDGE COUNTER SECTION
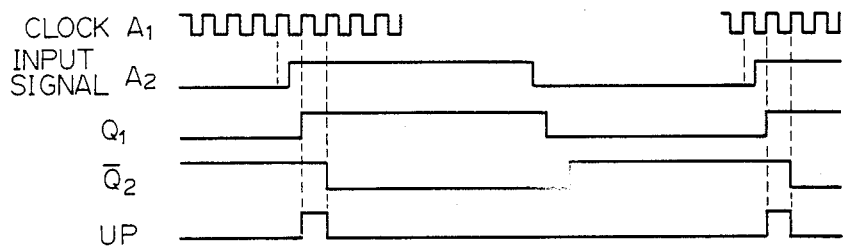
Fig. 4B  UP-DOWN COUNTER SECTION
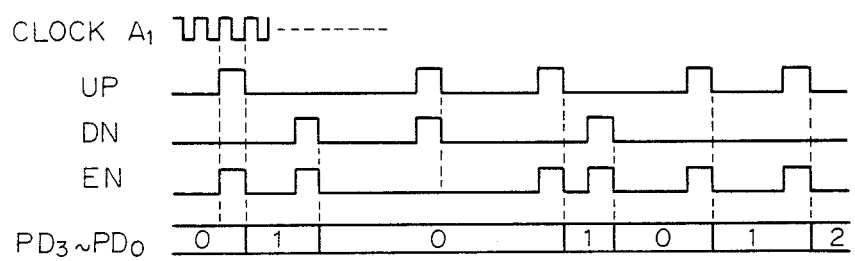

Fig. 4C  INTEGRATOR SECTION
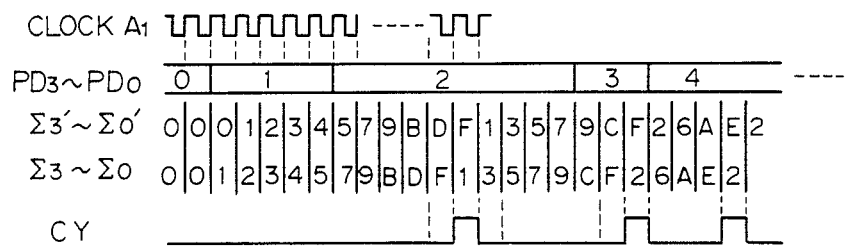
Fig. 4D  FREQUENCY DIVIDER SECTION
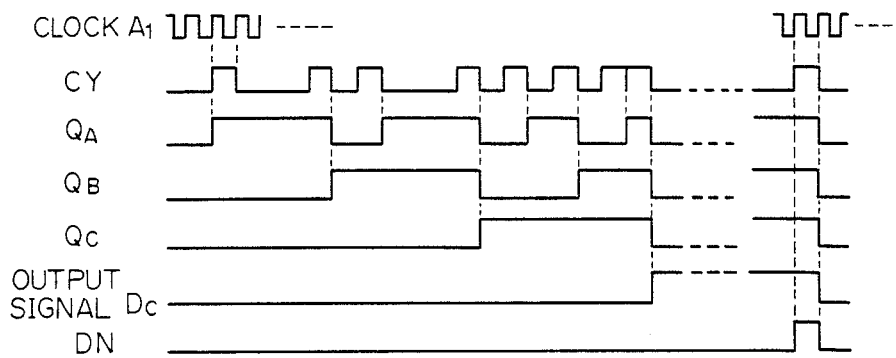

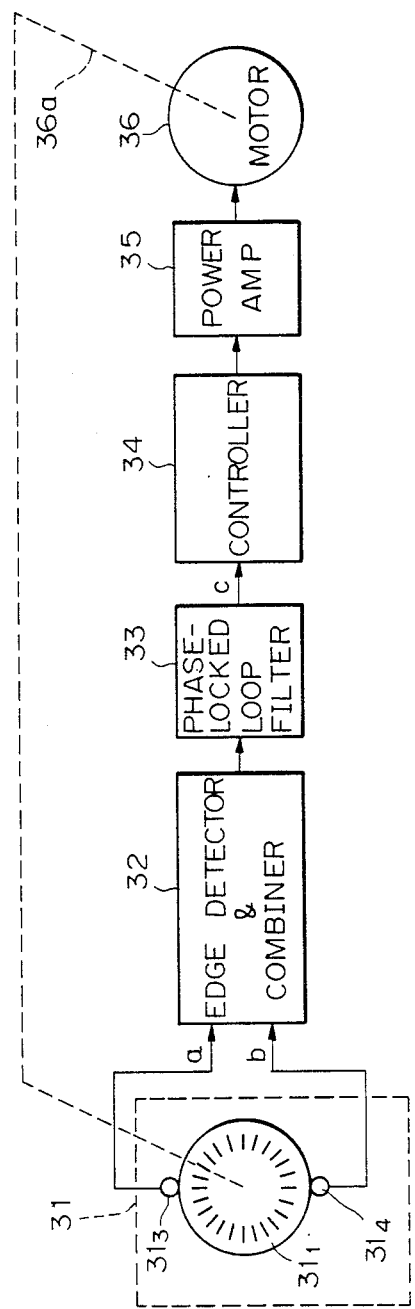

Fig. 9
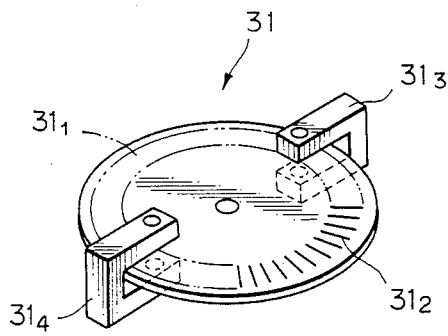
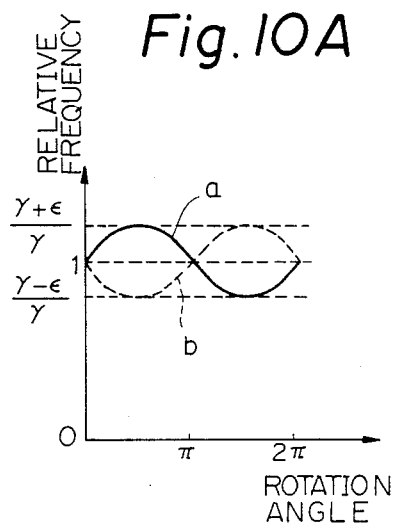
Fig. 10A
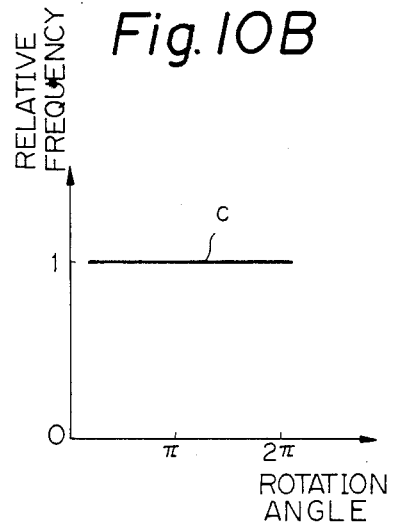
Fig. 10B

DIGITAL PHASE-LOCKED LOOP FILTER

BACKGROUND OF THE INVENTION

The present invention relates to a phase-locked loop filter and, more particularly, to a digital phase-locked loop filter applicable to a motor speed control which is installed in an optical disk apparatus and others.

A digital phase-locked loop filter of the kind described is disclosed in, for example, U.S. Pat. No. 4,019,153. A problem with the loop filter disclosed in this patent is that the lockable frequency range thereof is too narrow to accommodate a speed signal outputted by a speed sensor, which is responsive to a motor speed or the like, and the frequency of which varies over a relatively wide range, failing to control motor speed with accuracy.

SUMMARY OF THE INVENTION

It is, therefore, an object of the present invention to provide a digital phase-locked loop filter which solves the problem of the prior art loop filter as discussed above.

It is another object of the present invention to provide a digital phase-locked loop filter capable of controlling motor speed with accuracy following even a speed detection signal which is produced by a speed sensor responsive to, for example, the rotation of a motor and variable over a wide range.

It is another object of the present invention to provide a generally improved digital phase-locked loop filter.

In accordance with the present invention, there is provided a digital phase-locked loop filter having at least one phase-locked loop, the phase-locked loop comprising a counter supplied with an input signal and an output signal for counting a difference in phase between the input and output signals and producing a resulting count, an integrator supplied with the count and a clock signal for integrating the counts modulo a predetermined value at a period of the clock signal and, every time an overflow occurs, producing an overflow signal, and a frequency divider for generating the output signal by dividing a frequency of the overflow signal.

In accordance with the present invention, there is also provided a device for controlling rotation speed of a motor, comprising a speed sensor for producing two speed signals by sensing a rotation speed of the motor, an edge detector and combiner for detecting positive-going edges of the speed signals and combining the two signals such that the signals do not overlap each other with respect to a time axis, a phase-locked loop filter supplied with the combined signal for producing a signal output signal having a frequency which is proportional to the rotation speed of the motor, and a control responsive to the output signal of the filter for controlling device of the motor and, thereby, the rotation speed.

BRIEF DESCRIPTION OF THE DRAWINGS

FIGS. 4A to 4D are waveform diagrams demonstrating the operation of the circuit as shown in FIG. 3;

FIG. 8 is a schematic block diagram representative of a motor speed control to which a digital phase-locked loop filter in accordance with the present invention is applied;

FIG. 9 is a perspective view showing a specific construction of a speed sensor assembly as shown in FIG. 8;

FIGS. 10A and 10B are graphs showing a frequency-to-rotation-angle characteristic of speed signals outputted by the speed sensor assembly of FIG. 9;

DESCRIPTION OF THE PREFERRED EMBODIMENTS

Figure 1:
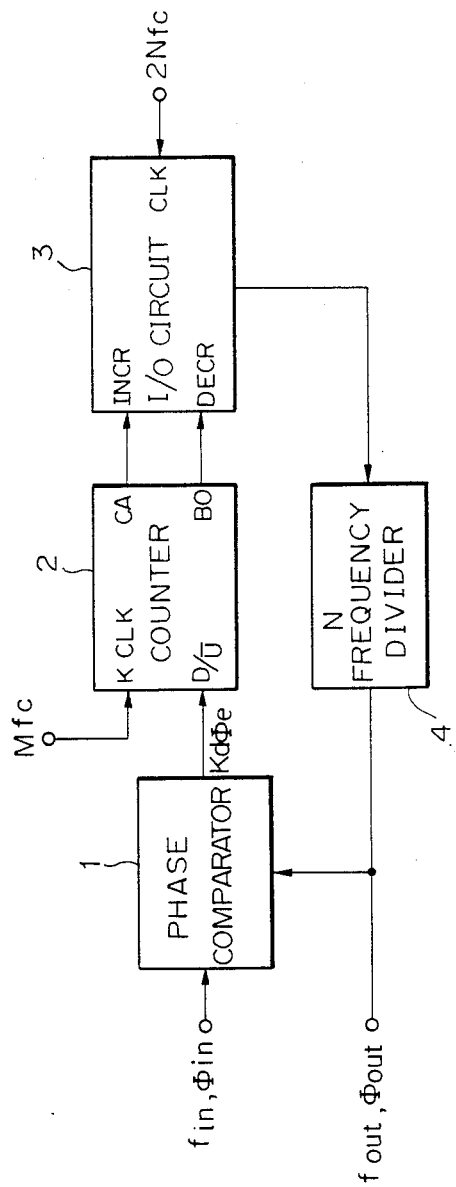
FIG. 1 is a schematic block diagram showing a prior art digital phase-locked loop filter.

To better understand the present invention, a brief reference will be made to a prior art digital phase-locked loop filter of the type disclosed in U.S. Pat. No. 4,019,153, shown in FIG. 1. As shown, the loop filter basically comprises a phase comparator 1, a K counter 2, an I/D (Increment/Decrement) circuit 3, and an N frequency divider. A K clock $M_{fc}$ is applied to a clock input terminal KCLK of the K counter 2. The frequency of an input signal to the phase comparator 1 is labeled $f_{in}$. Further, labeled $2N_{fc}$ is the clock applied to the I/D circuit 3, $f_{out}$ the frequency of an output signal, $\Phi_{in}$ the phase of an input signal to the phase comparator 1, and $\Phi_{out}$ the phase of an output signal. The phase comparator 1 compares the phase $\Phi_{in}$ of the input signal with the phase $\phi_{out}$ of the output signal which is produced via the K counter 2, I/D circuit 3 and N frequency divider 4 and applies to an input terminal D/U of the K counter 2 an erλor signal $K_d\Phi_e$ representative of a result of comparison. The K counter 2 and I/D circuit 3 are adapted to generate signals. The output signal of the I/D circuit 3 is fed back to the phase comparator 1 via the N frequency divider to be compared in phase with the input signal which is applied to the phase comparator 1.

The K counter 2 is made up of an up-counter and a down-counter each having a carry output terminal CA and a borrow output terminal BO. In response to the output $K_d\Phi_d$ of the phase comparator 1, the K counter 2 selects either one of the up- and down-counter. The carry output terminal CA and the borrow output terminal BO of the K counter 2 are coupled to, respectively, an increment input terminal INCR and a decrement input terminal DECR of the I/D circuit 3. When a single pulse arrives at the decrement input terminal DECR, half a cycle is removed from the output of the I/D circuit 3; when a single pulse arrives at the increment input terminal INCR, half a cycle is added to the output of the I/D circuit 3. While no signal is applied to the increment and decrement terminals INCR and DECR, the I/D circuit 3 produces a pulse train whose frequency is half the frequency of an I/D clock applied to an input terminal CLK.

In detail, when a (logical) low level signal, L, appears on the output of the phase comparator 1 in response to the input signals $f_{in}$ and $f_{out}$, the K counter 2 is conditioned for up-counting to produce a carry pulse. This carry pulse is fed to the increment input terminal INCR of the I/D circuit 3, resulting that half a cycle is added to the output of the I/D circuit 3. Conversely, when a (logical) high level signal, H, appears on the output of the phase comparator 1, the K counter 2 is conditioned for down-counting to feed a borrow pulse to the decrement input terminal DECR of the I/D circuit 3, whereby half a cycle is removed from the output of the I/D circuit 3. By such a sequence of operations, the phase of the output signal $f_{out}$ is continuously adjusted.

However, when such a prior art digital phase-locked loop filter is applied to a motor speed control, the lockable frequency range thereof is too narrow to effect accurate motor speed control, as discussed earlier.

Figure 2:
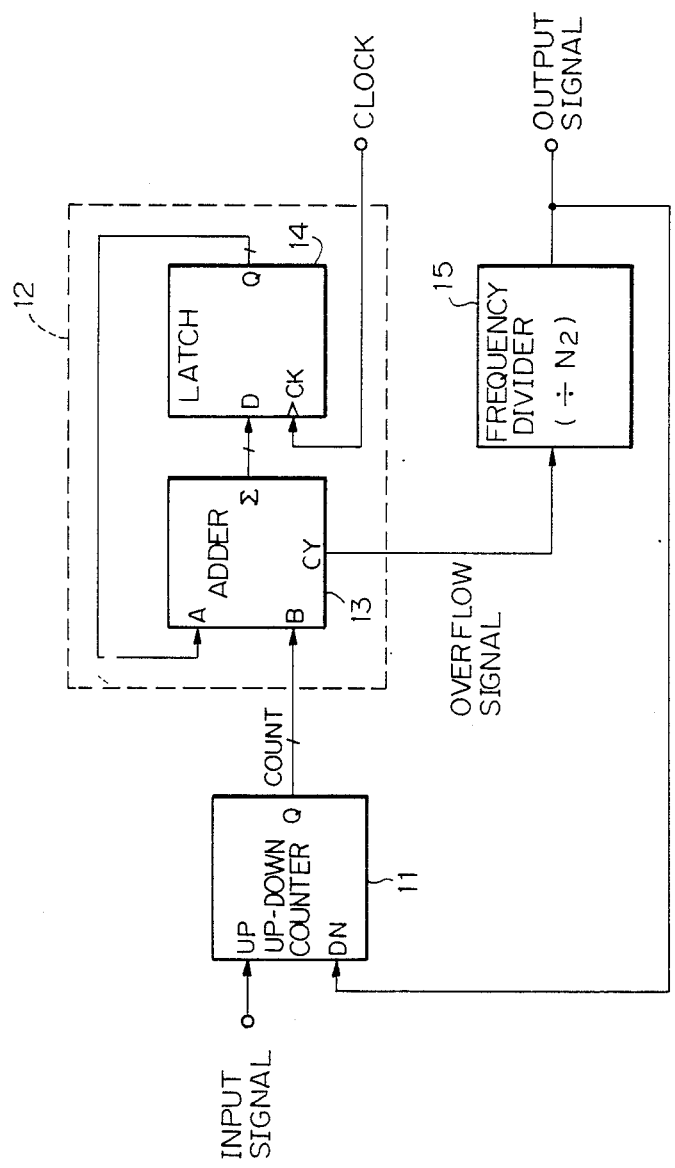
FIG. 2 is a schematic block diagram showing a digital phase-locked loop filter embodying the present invention.

Referring to FIG. 2, a digital phase-locked loop filter in accordance with the present invention is shown. As shown, the loop filter generally comprises an up-down counter 11, an integrator 12 made up of an adder 13 and a latch 14, and a frequency divider 15. The up-down counter 11 up-counts in response to an input signal to the loop filter which is applied to an up terminal UP and down-counts in response to an output signal which is applied to a down terminal DN, counting a phase difference between the input and output signals. The count produced by the counter 11 is fed from its output terminal Q to the integrator 12. The integrator 12 integrates the counts from the up-down counter 11 which are fed to a terminal B thereof, at the period of a clock applied to a clock terminal CK of the latch 14 and modulo a predetermined value. The output of the latch 14 is coupled to a terminal A of the adder 13. Every time the figure overflows during integration, an overflow signal appears on a carry terminal CY of the adder 13 and is fed to the frequency divider 15. In response, the frequency divider 15 divides the overflow signal from the integrator 12 to thereby produce an output signal of the loop filter. The output of the frequency divider 15 is fed back to the down terminal DN of the up-down counter 11.

Figure 3:
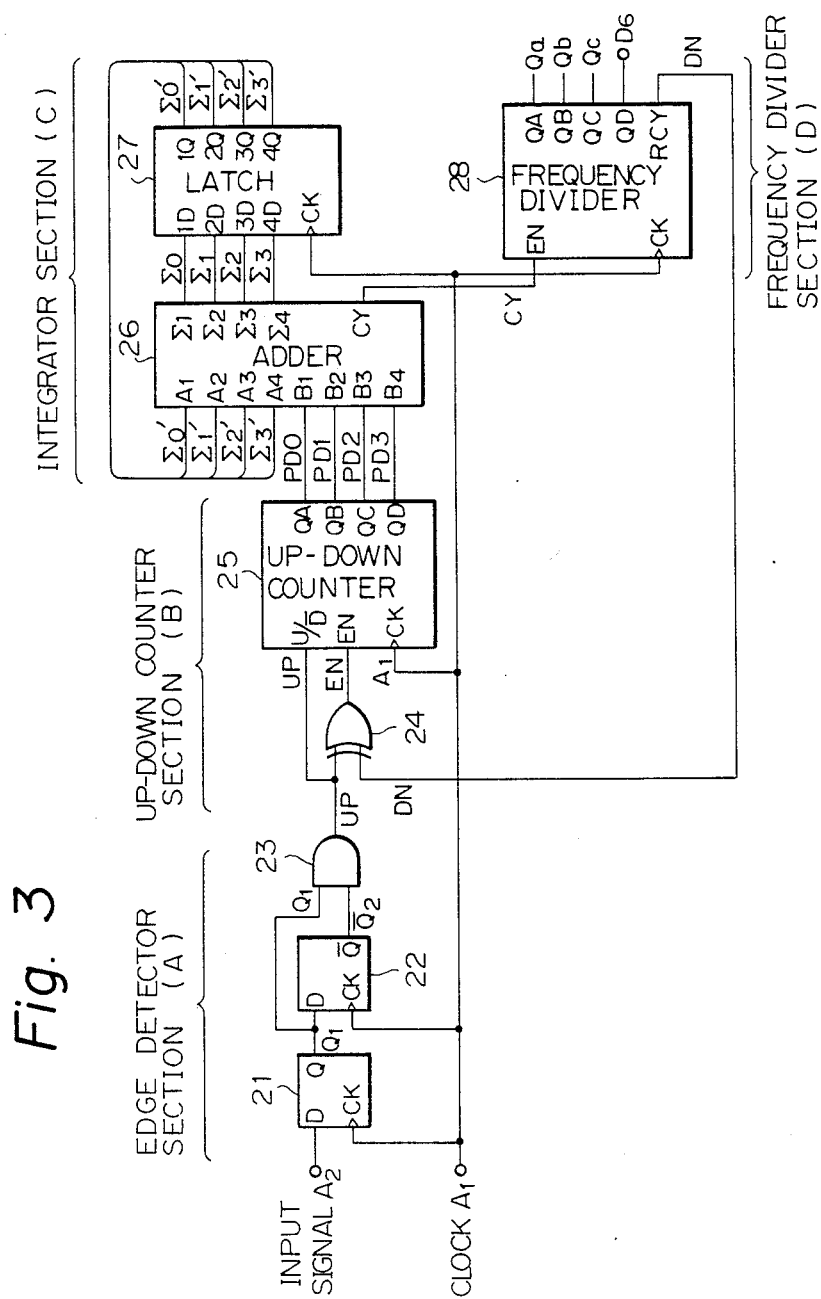
FIG. 3 is diagram showing a specific construction of the filter of FIG. 2.

FIG. 3 shows a detailed construction of the phase-locked loop filter of FIG. 2. The operation of the loop filter shown in FIG. 3 will be described with reference to FIG. 4 as well.

An edge detector section (A) is made up of D-type flip-flops 21 and 22, and an AND gate 23. While an input signal $A_2$ shown in FIG. 4A is applied to a D terminal of the flip-flop 21, a clock $A_1$ also shown in FIG. 4A is applied to a clock terminal CK of each of the flip-flops 21 and 22. A $Q_1$ signal shown in FIG. 4A appears on a terminal Q of the flip-flop 21 and is applied to the terminal D of the flip-flop 22. Appearing on an output terminal Q of the flip-flop 22 is a $Q_2$ signal as shown in FIG. 4A. The $Q_1$ and $Q_2$ signals are fed to the AND gate 23 which then produces a up-count signal UP as shown in FIG. 4A.

As stated above, the edge detector section (A) detects a positive-going edge of the input signal and, thereby, produces a single up-count signal UP per period of the input signal, the signal UP being fed to an up-down counter section (B).

The up-down counter section (B) comprises an Exclusive-OR (EX-OR) gate 24 and an up-down counter 25. Applied to the EX-OR gate 24 are the up-count signal UP as produced by the AND gate 23 and a down-count signal DN, FIG. 4B, as produced by a frequency divider 28. The up-down counter 25 has an U/$\overline{D}$ terminal to which the up-count signal UP is applied, an enable terminal EN to which an output of the EX-OR gate 24, or count enable signal EN, is applied, and a clock terminal CK to which the clock signal $A_1$ is applied. The up-down counter section (B) up-counts in response to the up-counter signal UP as shown in FIG. 4B, and down-counts in response to the down-count signal as also shown in FIG. 4B, thereby detecting a phase difference between the input and output signals. As shown in FIG. 4B, the count enable signal NE, i.e, output of the EX-OR gate 24 appears only when one of the up-count and down-count signals is produced and does not appear when the up-count and down-count signals are produced at the same time. This is because performing up-counting and down-counting at the same time is the same as not performing a counting operation at all. Signals (counts) PD3 to PD0 shown in FIG. 4B appear on output terminals QD to QA of the up-down counter 25 to be fed to an integrator section (C). It is to be noted that the signals PD3 to PD0 are represented by hexa (HEX) notation.

The integrator section (C) comprises an adder 26 and a latch 27. In this particular embodiment, the adder 26 is implemented with a 4-bit full adder. The adder 26 integrates the counts PD3 to PD0 outputted by the up-down counter 25 as shown in FIG. 4C modulo a predetermined value (16 in the illustrative embodiment), feeding to the latch 27 sum outputs $\Sigma 3$ to $\Sigma 0$ as shown in FIG. 4C. Clocked by the clock signal $A_1$, the latch 27 reads in the sum outputs $\Sigma 3$ to $\Sigma 0$ to in turn feed its outputs $\Sigma 3'$ to $\Sigma 0'$ to, respectively, terminals $A_4$ to $A_1$ of the adder 26. Again, PD3 to PD0, $\Sigma 3$ to $\Sigma 0$, and $\Sigma 3'$ to $\Sigma 0'$ are each represented by hexa (HEX) notation. When an overflow occurs during such integration as performed by the adder 26, an overflow signal CY shown in FIG. 4C appears on a terminal CY and is fed to a terminal EN of the frequency divider 28.

Assuming that the count applied to the integrator section (C) is PD, and that the modulo assigned to the integrator is $N_1$, the overflow signal stated above appears PD times during $N_1$ periods of the clock signal which is fed to the integrator section (C). Specifically, assuming that the period of the clock signal is $F_{ck}$, the number of times of appearance (frequency) of the overflow signal CY per unit time is represented by $$\frac{F_{ck}}{N_1} \cdot PD$$

It will be seen that the frequency mentioned above is proportional to the count.

A frequency divider section (D) is implemented with, in this particular embodiment, a 4-bit counter. The frequency divider 28 divides by, in this embodiment, 16 the overflow signal CY, FIG. 4D, which is produced by the adder 26 as previously stated. An output signal $D_6$ shown in FIG. 4D appears on a terminal QD of the frequency divider 28. Further, appearing on terminals QA, QB and QC of the frequency divider 28 are, respectively, a ½ output Qa, a ¼ output Qb and a ⅛ output Qc, as shown in FIG. 4D. The down-count signal DN appearing once per period of the signal, FIG. 4D, appearing on a terminal RCY of the frequency divider 28 is fed back to one input terminal of the EX-OR gate 24.

Figure 5:
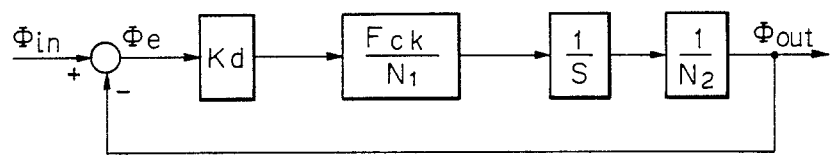
FIG. 5 is a schematic block diagram showing another embodiment of the present invention.

To understand the operation of the circuit shown in FIG. 2 or 3 in the control theory domain, the system may be regarded as a linear system and represented by a transfer block diagram, as shown in FIG. 5. In FIG. 5, $K_d$ is representative of the gain coefficient of the phase comparator which corresponds to a count as produced per period of the input and output signals. Represented by $F_{ck}/N_1$ is the count-to-frequency conversion coefficient of the integrator which is defined by the operation of the integrator. 1/S (S being the Laplace operator) is representative of an integrating system and, here, conversion of the unit system of overflow signal to the phase amount. Further, $N_2$ is representative of the division ratio of the frequency divider.

From the transfer block diagram, the closed loop transfer function H(S) of the phase-locked loop filter described above is produced by:

$$H(S) = \frac{K_v}{S + K_v} \quad (1)$$

where $K_v$ is the loop gain which is in turn expressed as $$K_v = \frac{K_d F_{Ck}}{N_1 N_2} \text{ [rad/S]} \quad (2)$$

The band width $F_c$ is produced by:

$$F_C = \frac{K_v}{2\pi} \text{ [Hz]} \quad (3)$$

The relationship between the phase difference $\Phi_e$ ($=\Phi_{in}-\Phi_{out}$) and the frequency $f_{out}$ of the output signal is expressed as:

$$f_{out} = \frac{K_d F_{Ck}}{N_1 N_2} \cdot \Phi_e \text{ [Hz]} \quad (4)$$

At the lockable maximum frequency, the count produced by the up-down counter, i.e., $K_d \cdot \Phi_e$ of the equation (4) also reaches the maximum value. Hence, assuming $K_d \cdot \Phi_e = C_{max}$, then the equation (4) may be modified as:

$$f_{out} = \frac{C_{max} \cdot F_{Ck}}{N_1 N_2} \text{ [Hz]} \quad (5)$$

So long as the number of bits in the up-down counter and that in the integrator are equal to each other, there holds an equation:

$$C_{max} = N_1 - 1$$

Hence, the maximum frequency is given by:

$$f_{out} = \frac{(N_1 - 1)}{N_1 N_2} \cdot F_{Ck} \text{ [Hz]} \quad (6)$$

As regards the specific construction shown in FIG. 3, assuming the $F_{ck}$ is 100 KHz by way of example, the band width is produced on the basis of the equation (3), as follows:

$F_c \delta 62.2$ Hz

It will be seen from the equation (6) that the lockable input signal frequency range is 0 to about 5.859 KHz.

Figure 7:
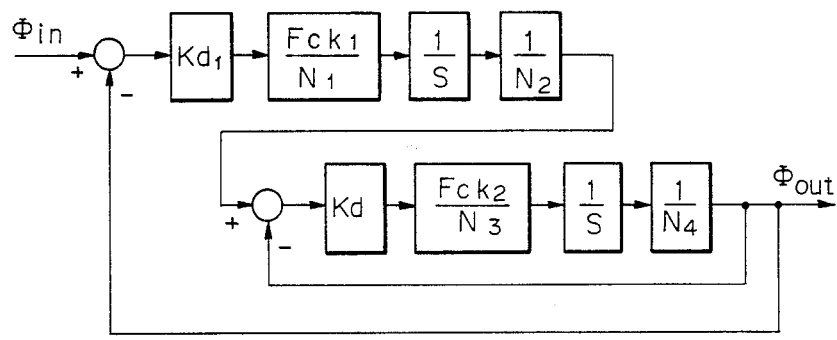
FIG. 7 is a transfer block diagram associated with the construction of FIG. 6.
Figure 6:
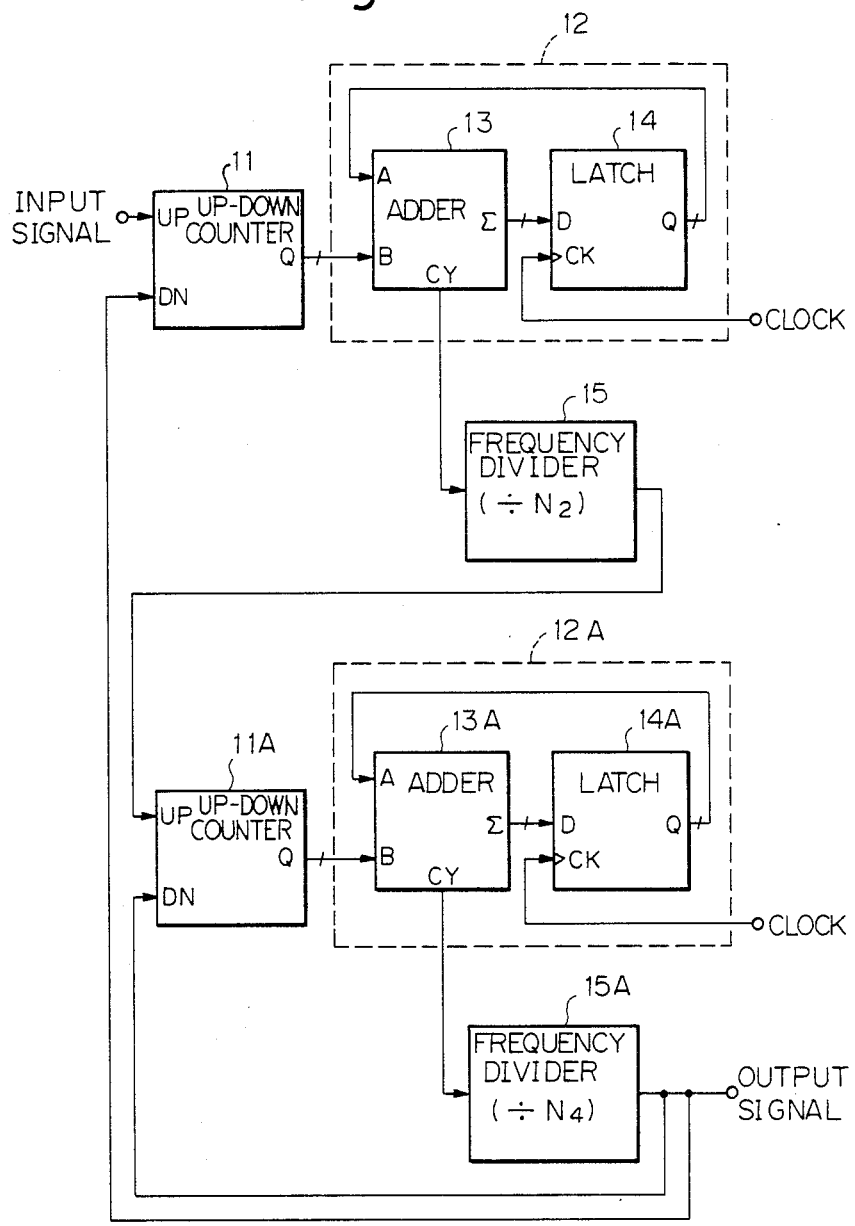
FIG. 6 is a schematic block diagram showing another embodiment of the present invention.

Referring to FIG. 6, another embodiment of the present invention is shown which includes two phase-locked loops each being constructed as shown in FIG. 2. The transfer block diagram of the phase-locked loop shown in FIG. 6 is shown in FIG. 7. In FIG. 7, there are shown the gain coefficient $K_{d1}$ of the up-down counter 11, the gain coefficient $K_{d2}$ of an up-down counter 11A, the frequency $F_{ck1}$ of the clock signal applied to the integrator 12, the frequency $F_{ck2}$ of a clock signal applied to an integrator 12A, the modulo $N_1$ assigned to the integrator 12, the modulo $N_3$ assigned to the integrator 12A, the division ratio $N_2$ of the frequency divider 15, and the division ratio $N_4$ of a frequency divider 15A.

It will be seen from the transfer block diagram of FIG. 7 that the closed loop transfer function H(S) of the phase-locked loop filter of FIG. 6 is expressed as:

$$H(S) = \frac{\omega_n^2}{S^2 + 2\zeta\omega_n S + \omega_n^2} \quad (7)$$

where $\omega_n$ is the natural frequency of the loop and $\zeta$ is the damping coefficient.

Assume the following equations:

$$\omega_1 = \frac{K_{d1} \cdot F_{Ck1}}{N_1 N_2} \text{ [rad/S]} \quad (8)$$

$$\omega_2 = \frac{K_{d2} \cdot F_{Ck2}}{N_3 N_4} \text{ [rad/S]} \quad (9)$$

Then, the natural frequency $\omega_n$ and damping coefficient $\zeta$ included in the equation (7) are related as follows:

$$\omega_n = \sqrt{\omega_1 \omega_2} \text{ [rad/S]} \quad (10)$$

$$\zeta = \frac{1}{2} \sqrt{\frac{\omega_2}{\omega_1}} \quad (11)$$

It follows that the natural frequency $\omega_n$ and the damping coefficient $\zeta$ can be selected as desired depending upon $\omega_1$ and $\omega_2$.

A specific application of the phase-locked loop in accordance with the present invention will be described hereinafter.

Referring to FIG. 8, there is shown a motor speed control to which the present invention is applied. A signal proportional to the rotation speed of a motor 36 is produced by two sensors $31_3$ and $31_4$ of a speed sensor assembly 31 which is provided with a shield plate $31_1$, which is mounted on an output shaft $36a$ of the motor 36. Specifically, two motor speed signals a and b outputted by the speed sensor assembly 31 and proportional to the rotation speed of the motor 36 are routed to an edge detector and combiner 32. The edge detector and combiner 32 detects positive-going edges of the two motor speed signals a and b and combine the signals a and b such that they do not overlap each other with respect to the time axis, the resulting signal being fed to a phase-locked loop filter 33 in accordance with the present invention. In the filter 33, the two signals are combined to become a single signal the frequency of which is proportional to the rotation speed of the motor 36. The output c of the filter 33 is applied to the motor 36 via a controller 34 and a power amplifier 35, whereby the rotation speed of the motor 36 is controlled.

A specific construction of the speed sensor assembly 31 is shown in FIG. 9. As shown, the shield plate $31_1$ is provided with slits $31_2$ in its peripheral portion. The sensors $31_3$ and $31_4$ each consisting of a light-emitting element and a light-sensitive element are arranged to face each other at an angular distance of 180 degrees, the center being defined by the output shaft $36a$ of the motor 36. The sensors $31_3$ and $31_4$ produce, respectively, the binary signals a and b depending upon the presence/absence of the slits $31_2$ and following the rotation of the shield plate $31_1$. So long as the center of the shield plate $31_1$ and that of the motor output shaft $36a$ are accurately aligned, the frequencies of the signals a and b are proportional to the rotation speed of the motor output shaft $36a$. However, when the center of the shield plate $31_1$ and that of the motor output shaft $36a$ are offset from each other, the frequencies of the signals a and b are varied with the rotation angle relative to each other in the form of sinusoidal waves, as shown in FIG. 10A. Specifically, in the case that the sensors $31_3$ and $31_4$ are located at an angular distance of 180 degrees from each other and at a radius of r as measured from the center of the motor output shaft $36a$, assuming that the center of rotation of the shield plate $31_1$ and the center of the motor output shaft $36a$ are offset by $\epsilon$ ($\epsilon << r$), the ratio of the apparent rotation speed sensed by the sensors $31_3$ and $31_4$ to the true rotation speed of the motor output shaft $36a$ is varied during one rotation of the motor output shaft $36a$, as shown in FIG. 10A. It will be noted that in the condition shown in FIG. 9 the apparent variation of rotation speed (indicated by a dotted line b in FIG. 10A) sensed by the sensor $31_4$ cancels that sensed by the sensor $31_3$ (indicated by a solid line a in FIG. 10A) and, therefore, the offset between the center of rotation of the shield place $31_1$ and the center of the motor output shaft $36a$ can be cancelled.

The speed sensor assembly 31 shown in FIG. 9 is incapable of directly producing a frequency which is proportional to the rotation speed of the motor 36. Nevertheless, with the construction shown in FIG. 8 which includes the filter 33 of the present invention, it is possible to produce a single signal c, FIG. 10B, which is proportional to the motor speed by combining the two signals a and b. It is to be noted that the light-emitting element and light-sensitive element which implement each of the sensors $31_3$ and $31_4$ as shown and described may be replaced with an optical reflection type sensor or an electromagnetic sensor.

Figure 11:
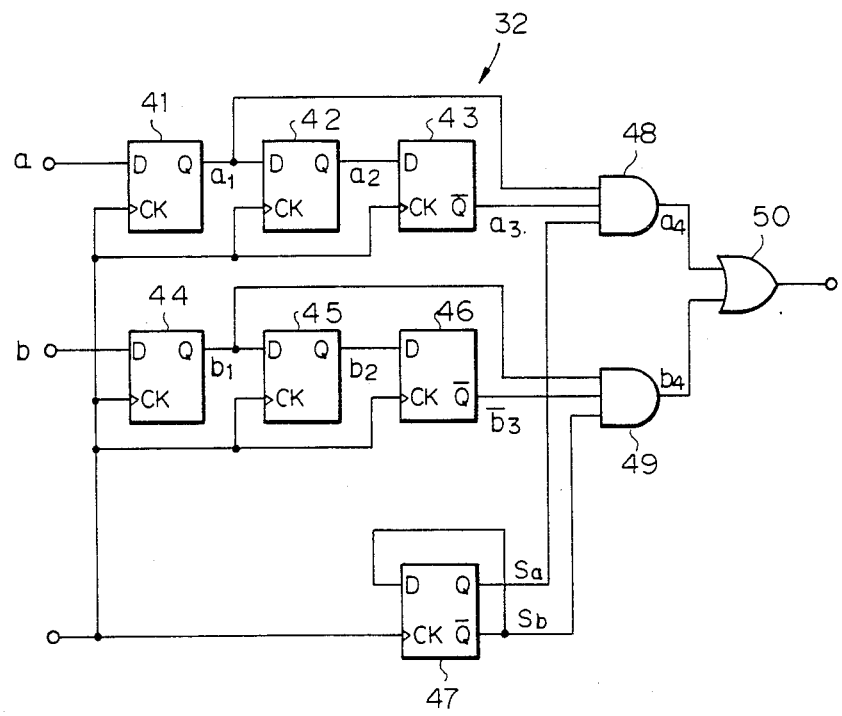
FIG. 11 is a schematic block diagram showing a specific construction of an edge detector and combiner as shown in FIG. 8.

Referring to FIG. 11, a specific construction of the edge detector and combiner 32 of FIG. 8 is shown. As shown, the edge detector and combiner 32 includes D-type flip-flops 41, 42 and 43 for detecting and delaying positive-going edges of the signal a as produced by the sensor $31_3$, D-type flip-flops 44, 45 and 46 for detecting and delaying positive-going edges of the signal b as produced by the sensor $31_4$, a D-type flip-flop 47 for dividing the frequency of a clock signal fed to each of the flip-flops 41 to 46 so that the output signals a and b of the sensors $31_3$ and $31_4$, respectively, may be combined without overlapping each other with respect to the time axis, AND gates 48 and 49, and an OR gate 50.

Figure 12:
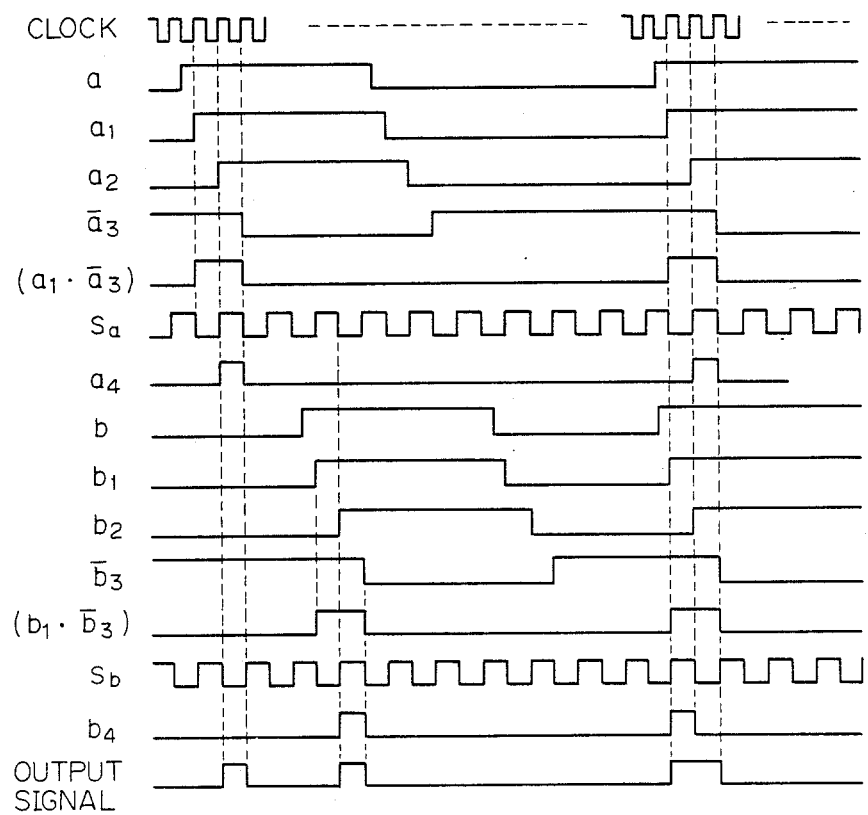
FIG. 12 is a waveform demonstrating the operation of the circuit of FIG. 11.

The operation of the edge detector and combiner 32 having the above construction will be described with reference to FIG. 12. Applied to a terminal CK of each of the flip-flops 41 to 47 is a clock signal as shown in FIG. 11. Applied to a terminal D of the flip-flop 41 is the signal a as outputted by the sensor $31_3$, as also shown in FIG. 11. A delayed signal $a_1$ appears on a terminal Q of the flip-flop 41. The signal $a_1$ is fed to a terminal D of the flip-flop 42 to be thereby further delayed, a signal $a_2$ appearing on a terminal Q of the flip-flop 42. The signal is applied to a terminal D of the flip-flop 43 to be further delayed and inverted, a signal $\overline{a_3}$ appearing on a terminal $\overline{Q}$ of the flip-flop 43. On the other hand, the signal b outputted by the sensor $31_4$ is routed to a terminal D of the flip-flop 44, a delayed signal $b_1$ appearing on a terminal Q of the flilp-flop 44. The signal $b_1$ is applied to a terminal D of the flip-flop 45 to be further delayed to become a signal $b_2$. Fed to a terminal D of the flip-flop 46, the signal $b_2$ is further delayed and inverted resulting that a signal $\overline{b_3}$ appears on a terminal $\overline{Q}$ of the flip-flop 46.

The flip-flop 47 has a terminal $\overline{Q}$ connecting to a terminal D and receives a clock signal at its terminal CK. A signal $S_a$ which changes at each positive-going edge of the clock signal as shown in the figure appears on the terminal Q of the flip-flop 47 while an inverted version of the signal $S_a$, i.e., signal $S_b$ appears on a terminal $\overline{Q}$. Applied to the AND gate 48 are the signal $a_1$ from the flip-flop 41, the signal $\overline{a_3}$ from the flip-flop 43, and the signal $S_a$ from the flip-flop 47. The AND of the signals $a_1$ and $\overline{a_3}$, i.e., $a_1 \cdot \overline{a_3}$ which is shown in the figure is ANDded with the signal $S_a$ by the AND gate 48, wherby a signal $a_4$ is produced. Fed to the AND gate 49 are the signal $b_1$ from the flip-flop 44, the signal $\overline{b_3}$ from the flip-flop 46, and the signal $S_b$ from the flip-flop 47. The AND of the signals $b_1$ and $\overline{b_3}$, i.e., $b_1 \cdot \overline{b_3}$ is ANDded with the signal $S_b$, a signal $b_4$ being produced by the AND gate 49. The signal $a_4$ from the AND gate 48 and the signal $b_4$ from the AND gate 49 are fed to the OR gate 50 to be ANDed thereby. The output of the OR gate 50 is applied to the phase-locked loop filter 33.

As stated above, the edge detector and combiner 32 detects positive-going edges of the two signals a and b as produced by the sensors $31_3$ and $31_4$ and combine them such that the signals a and b do not overlap each other with respect to the time axis.

When the edge detector and combiner 32 shown in FIG. 11 is substituted for, for example, the edge detector section (A) of FIG. 3, the output signal of the phase-locked loop filter will surely have a frequency which is proportional to the means value of the frequencies of the signals a and b, i.e., the rotation speed of the motor output shaft $36a$ as shown in FIG. 10B.

Further, a signal having a smaller division ratio than the output signal of the phase-locked loop filter (e.g. QA, QB and QC of the frequency divider 28 shown in FIG. 3) may be used. This allows the use of a signal which is produced by multiplying the frequency of the output signal of the speed sensor, whereby apparently the same effect as would be produced by increasing the resolution of the speed sensor is achievable.

In summary, it will be seen that a phase-locked loop filter in accordance with the present invention is desirably applicable to a motor speed control of, for example, an optical disk device to enhance accurate control over motor rotation.

Various modifications will become possible for those skilled in the art after receiving the teachings of the present disclosure without departing from the scope thereof.

What is claimed is:

1. A digital phase-locked loop filter having at least one phase-locked loop, said phase-locked loop comprising:
counter means supplied with an input signal and an output signal for counting a difference in phase between said input and output signals and producing a resulting count;
integrator means supplied with said count and a clock signal for integrating said counts modulo a predetermined value at a period of said clock signal and, every time an overflow occurs, producing an overflow signal; and
frequency divider means for generating said output signal by dividing a frequency of said overflow signal.

2. A digital phase-locked loop filter as claimed in claim 1, wherein said counter means and said integrator means each has more than one bit.

3. A digital phase-locked loop filter as claimed in claim 2, wherein said counter means comprises an up-down counter which up-counts in response to said input signal and down-counts in response to said output signal.

4. A digital phase-locked loop filter as claimed in claim 3, wherein said integrator means comprises a latch supplied with said clock signal, and an adder supplied with said counts and an output of said latch for producing said overflow signal.

5. A digital phase-locked loop filter as claimed in claim 1, wherein said counter means comprises an edge detector for detecting a positive-going edge of said input signal and producing a single up-counting signal per period of said input signal, and an up-down counter up-counting in response to said up-count signal and down-counting in response to a down-count signal outputted by said frequency divider for comparing a phase of said input signal and a phase of said output signal to thereby determine said phase difference.

6. A digital phase-locked loop filter as claimed in claim 5, wherein said integrator means comprises an adder integrating said counts modulo said predetermined value and producing a resulting sum, and a latch supplied with a clock signal for reading in said sum of said adder while feeding an output of said latch to said adder.

7. A digital phase-locked loop filter as claimed in claim 6, wherein said frequency divider means comprises a frequency converter which generates said output signal by dividing said overflow signal and produces said down-count signal once per period of said output signal.

8. A device for controlling rotation speed of a motor, comprising:
speed sensor means for producing two speed signals by sensing a rotation speed of said motor;
edge detector and combiner means for detecting positive-going edges of said speed signals and combining said two signals such that said signals do not overlap each other with respect to a time axis;
a phase-locked loop filter supplied with said combined signal for producing a single output signal having a frequency which is proportional to the rotation speed of said motor; and
control means responsive to said output signal of said filter for controlling drive of said motor and, thereby, the rotation speed.

* * * * *